United States Patent
Gerlach et al.

(10) Patent No.: US 7,315,042 B2
(45) Date of Patent: Jan. 1, 2008

(54) SEMICONDUCTORS CONTAINING TRANS-1,2-BIS(ACENYL)ETHYLENE COMPOUNDS

(75) Inventors: Christopher P. Gerlach, St. Paul, MN (US); Tommie W. Kelley, Shoreview, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 282 days.

(21) Appl. No.: 10/991,562

(22) Filed: Nov. 18, 2004

(65) Prior Publication Data

US 2006/0102893 A1    May 18, 2006

(51) Int. Cl.
*H01L 35/24*    (2006.01)
(52) U.S. Cl. .................. 257/40; 257/E39.007; 438/82; 438/99
(58) Field of Classification Search .............. 257/40, 257/E39.007; 438/82, 99
See application file for complete search history.

(56) References Cited

U.S. PATENT DOCUMENTS

| | | | |
|---|---|---|---|
| 5,121,029 A | 6/1992 | Hosokawa et al. | |
| 5,347,144 A * | 9/1994 | Garnier et al. ............... | 257/40 |
| 5,408,109 A | 4/1995 | Heeger et al. | |
| 5,503,910 A | 4/1996 | Matsuura et al. | |
| 5,621,131 A | 4/1997 | Kreuder et al. | |
| 5,708,130 A | 1/1998 | Woo et al. | |
| 5,728,801 A | 3/1998 | Wu et al. | |
| 5,840,217 A | 11/1998 | Lupo et al. | |
| 5,869,350 A | 2/1999 | Heeger et al. | |
| 5,900,327 A | 5/1999 | Pei et al. | |
| 5,929,194 A | 7/1999 | Woo et al. | |
| 6,030,715 A | 2/2000 | Thompson et al. | |
| 6,132,641 A | 10/2000 | Rietz et al. | |
| 6,150,043 A | 11/2000 | Thompson et al. | |
| 6,169,163 B1 | 1/2001 | Woo et al. | |
| 6,242,115 B1 | 6/2001 | Thomson et al. | |
| 6,265,243 B1 | 7/2001 | Katz et al. | |
| 6,355,365 B1 | 3/2002 | Hotta et al. | |
| 6,433,359 B1 | 8/2002 | Kelley et al. | |
| 6,617,609 B2 | 9/2003 | Kelley et al. | |
| 6,686,066 B2 | 2/2004 | Kwon et al. | |
| 6,953,947 B2 * | 10/2005 | Son et al. ..................... | 257/40 |
| 6,998,068 B2 | 2/2006 | Gerlach | |
| 7,037,767 B2 * | 5/2006 | Hirai .......................... | 438/149 |

(Continued)

FOREIGN PATENT DOCUMENTS

EP    0 861 845    9/1998

(Continued)

OTHER PUBLICATIONS

Garay et al., Macromolecules, vol. 27, No. 7, pp. 1922-1927, 1994 XP 000433199.

(Continued)

*Primary Examiner*—Eugene Lee
(74) *Attorney, Agent, or Firm*—Jean A. Lown; Stephen F. Wolf

(57) ABSTRACT

Semiconductor devices are described that include a semiconductor layer that contains a trans-1,2-bis(acenyl)ethylene compound. The acenyl group is selected from 2-naphtyl, 2-anthracenyl, or 2-tetracenyl. Additionally, methods of making semiconductor devices are described that include depositing a semiconductor layer that contains a trans-1,2-bis(acenyl)ethylene compound.

21 Claims, 5 Drawing Sheets

U.S. PATENT DOCUMENTS

| | | | |
|---|---|---|---|
| 7,109,519 | B2 | 9/2006 | Gerlach |
| 2003/0102471 | A1 | 6/2003 | Kelley et al. |
| 2003/0105365 | A1 | 6/2003 | Smith et al. |
| 2003/0175551 | A1 | 9/2003 | Smith et al. |
| 2004/0004433 | A1 | 1/2004 | Lamansky et al. |
| 2004/0062947 | A1 | 4/2004 | Lamansky et al. |
| 2004/0115476 | A1* | 6/2004 | Oshiyama et al. ......... 428/690 |
| 2004/0119049 | A1* | 6/2004 | Heeney et al. ........... 252/299.3 |
| 2004/0222412 | A1 | 11/2004 | Bai et al. |
| 2005/0012090 | A1 | 1/2005 | Gerlach |
| 2005/0159581 | A1* | 7/2005 | Vanderzande et al. ...... 528/391 |
| 2005/0274945 | A1* | 12/2005 | Fallis et al. ................... 257/40 |
| 2006/0102893 | A1 | 5/2006 | Gerlach et al. |
| 2006/0105199 | A1 | 5/2006 | Gerlach et al. |

FOREIGN PATENT DOCUMENTS

| | | |
|---|---|---|
| EP | 1 094 101 | 4/2001 |
| JP | 2000-195673 | 7/2000 |
| WO | WO 98/55561 | 12/1998 |
| WO | WO 99/40655 | 8/1999 |
| WO | WO 00/18851 | 4/2000 |

OTHER PUBLICATIONS

Wettermark et al., ARKIV for KEMI, vol. 30, No. 17, pp. 185-212, 1968 XP008057681.

Wismontski-Knittel et al., J. Phys. Chem. vol. 87, No. 10, pp. 1745-1752, 1983 XP008057674.

Becker et al., J. Am. Chem. Soc., 113, 1121-1127, 1991.

Corey et al., J. Org. Chem., 40, 3788-3789, 1975.

Gerlach, Acene-Thiophene Semiconductors, U.S. Appl. No. 10/641,730, filed Aug. 15, 2003.

Inoue et al., J. Appl. Phys., 95, 5795-5799, 2004.

Ito et al., Angew Int. Ed., 42, 1159-1162, 2003.

Karatsu et al., Chem. Lett. 1232-1233, 2001.

Katz et al., Acc. Chem. Res. 34, 359-369, 2001.

Kraft et al., Chem. Phys. Chem., 2, 163-165, 2001.

Littke et al., J. Am. Chem. Soc. 124, 6343-6348, 2002.

Sheraw et al., Mat. Res. Soc. Symp. Proc. vol. 558, 403-408, 2000.

Campbell, T., et al., "Synthesis of Hydrocarbon Derivatives by the Wittig Synthesis, I. Distyrylbenzenes" vol. 24, pp. 1246-1251 (1959).

Chen, C., et al., "Recent Developments in Molecular Organic Electroluminescent Materials", *Macromol. Symp.*, vol. 125, pp. 1-48 (1997).

Fischer, E., "Emission Spectroscopy Evidence for the Existence of Rotamers in Solutions of *trans*-Diarylethylenes and Related Compounds", *Journal Of Photochemistry*, vol. 17, pp. 331-340, (1981) XP-002371956.

Fischer, G. et al., "Conformation Equllibria in *trans*-1,2-Diarylethylenes Manifested in Their Emission Spectra", *Journal of Phys. Chem.* vol. 85, pp. 2611-2613, (1981) XP-002371957.

Kraft, A., et al., "Electroluminescent Conjugated Polymers—Seeing Polymers in a New Light", *Angew. Chem. Int. Ed.*, vol. 37, pp. 402-428 (1998).

Segura, J., et al., "Oligo-2,6-naphthylenes—New Building Blocks for the Preparation of Photoluminescent Polymeric Materials", *Eur. J. Org. Chem.*, pp 643-651, (1999), XP-002371959.

Sun, Y., et al., "Three-Component Self-Modeling Technique Applied to Luminescence Spectra", *Anal. Chem.*, vol. 59, pp. 2515-2519, (1987), XP-002371958.

\* cited by examiner

SEMICONDUCTORS CONTAINING TRANS-1,2-BIS(ACENYL)ETHYLENE COMPOUNDS

TECHNICAL FIELD

The present invention provides semiconductor devices and methods of making semiconductor devices that include a semiconductor layer that contains a trans-1,2-bis(acenyl)ethylene compound.

BACKGROUND

Traditionally, inorganic materials have dominated the semiconductor industry. For example, silicon arsenide and gallium arsenide have been used as semiconductor materials, silicon dioxide has been used as an insulator material, and metals such as aluminum and copper have been used as electrode materials. In recent years, however, there has been an increasing research effort aimed at using organic materials rather than the traditional inorganic materials in semiconductor devices. Among other benefits, the use of organic materials may enable lower cost manufacturing of electronic devices, may enable large area applications, and may enable the use of flexible circuit supports for display backplanes or integrated circuits.

A variety of organic semiconductor materials have been considered, the most common being fused aromatic ring compounds as exemplified by tetracene and pentacene, bis(acenyl)acetylene, and acene-thiophenes; oligomeric materials containing thiophene or fluorene units; and polymeric materials such as regioregular poly(3-alkylthiophene). At least some of these organic semiconductor materials have performance characteristics such as charge-carrier mobility, on/off current ratios, and sub-threshold voltages that are comparable or superior to those of amorphous silicon-based devices.

Some organic semiconductor materials such as, for example, pentacene have a plurality of possible crystalline phases that can be formed. The electronic properties of organic semiconductor devices can vary depending on the crystalline phase or phases that are present. It has been recognized in the art that an organic semiconductor material that predominately forms one crystalline phase may decrease the variability encountered during the manufacture of organic semiconductor devices.

SUMMARY

Semiconductor devices and methods of making the semiconductor devices are provided. More specifically, the semiconductor devices include a semiconductor layer that contains at least one trans-1,2-bis(acenyl)ethylene compound.

In one aspect, semiconductor devices are provided that include a semiconductor layer that contains a trans-1,2-bis(acenyl)ethylene compound of Formula I.

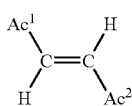

In Formula I, $Ac^1$ and $Ac^2$ are each independently an unsubstituted or substituted 2-acenyl selected from 2-naphthyl, 2-anthracenyl, or 2-tetracenyl. A substituted 2-acenyl group has at least one substituent selected from an alkyl, alkoxy, alkylthio, halo, haloalkyl, or a combination thereof.

In another aspect, a method of preparing a semiconductor device is provided. The method involves preparing a semiconductor layer that contains a trans-1,2-bis(acenyl)ethylene compound of Formula I. The semiconductor layer is often formed using a vapor deposition technique.

Some of the methods of preparing semiconductor devices are methods of preparing organic thin film transistors. One such method involves providing a gate electrode; depositing a gate dielectric layer on a surface of the gate electrode; preparing a semiconductor layer adjacent to a surface of the gate dielectric layer opposite the gate electrode; and positioning a source electrode and a drain electrode on a surface of the semiconductor layer that is opposite the gate dielectric layer. The source electrode and the drain electrode are separated from each other in an area on the surface of the semiconductor layer. The semiconductor layer contains a trans-1,2-bis(acenyl)ethylene compound of Formula I.

An additional method of preparing an organic thin film transistor involves providing a gate electrode; depositing a gate dielectric layer on a surface of the gate electrode; positioning a source electrode and a drain electrode adjacent to the gate dielectric layer opposite the gate electrode, wherein the source electrode and the drain electrode are separated by an area over the gate dielectric layer; and preparing a semiconductor layer on the source electrode, the drain electrode, and in the area between the source electrode and the drain electrode. The semiconductor layer includes a trans-1,2-bis(acenyl)ethylene compound of Formula I.

Another aspect provides a compound of formula

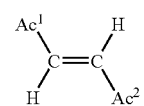

where $Ac^1$ and $Ac^2$ are each independently a 2-tetracenyl that is unsubstituted or substituted with an alkyl, alkoxy, alkylthio, halo, haloalkyl, or a combination thereof.

The above summary of the present invention is not intended to describe each disclosed embodiment or every implementation of the present invention. The Figures, Detailed Description, and Examples that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1A:
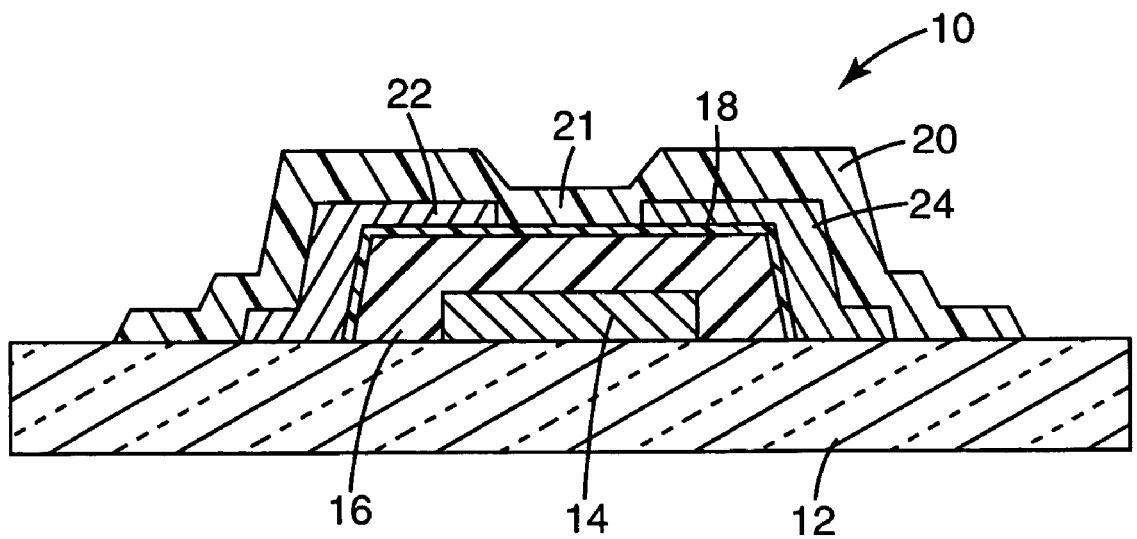
FIGS. 1a and 1b show a cross-sectional representation of two exemplary organic thin film transistors.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION OF THE INVENTION

The present invention provides semiconductor devices and methods of preparing semiconductor devices that include a semiconductor layer that contains a trans-1,2-bis(acenyl)ethylene compound. Suitable acenyl groups include those having 2 to 4 fused benzene rings.

Definition

As used herein, the terms "a", "an", and "the" are used interchangeably with "at least one" to mean one or more of the elements being described.

As used herein, the term "acene" refers to a polycyclic aromatic hydrocarbon group having at least 2 fused benzene rings in a rectilinear arrangement as shown by the following formula where n is an integer equal to or greater than zero.

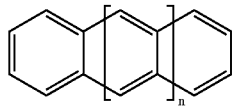

The acene usually has 2 to 4 fused benzene rings.

As used herein, the term "acenyl" refers to a monovalent radical of an acene. The acenyl group usually has 2 to 4 fused benzene rings in a rectilinear arrangement. Exemplary acenyl groups include naphthyl, anthracenyl, and tetracenyl.

As used herein, the term "alkyl" refers to a monovalent radical of an alkane. The alkyl can be linear, branched, cyclic, or combinations thereof and typically contains 1 to 30 carbon atoms. In some embodiments, the alkyl group contains 1 to 20, 1 to 14, 1 to 10, 4 to 10, 4 to 8, 1 to 6, or 1 to 4 carbon atoms. Examples of alkyl groups include, but are not limited to, methyl, ethyl, n-propyl, isopropyl, n-butyl, tert-butyl, isobutyl, n-pentyl, n-hexyl, cyclohexyl, n-octyl, n-heptyl, and ethylhexyl.

As used herein, the term "alkoxy" refers to a monovalent group of formula —OR where R is an alkyl group. Examples include methoxy, ethoxy, propoxy, butoxy, and the like.

As used herein, the term "halo" refers to a halogen group (i.e., F, Cl, Br, or I).

As used herein, the term "haloalkyl" refers to an alkyl substituted with at least on halo group.

As used herein, the term "alkylthio" refers to a monovalent group of formula —SR where R is an alkyl group.

Semiconductor Devices

Semiconductor devices are provided that have a semiconductor layer that contains a trans-1,2-bis(acenyl)ethylene compound of Formula I.

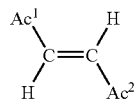

In Formula I, $Ac^1$ and $Ac^2$ are each independently an unsubstituted or substituted 2-acenyl selected from 2-naphthyl, 2-anthracenyl, or 2-tetracenyl. A substituted 2-acenyl group has at least one substituent selected from an alkyl, alkoxy, alkylthio, halo, haloalkyl, or a combination thereof (i.e., the compound can have more than one substituent).

The $Ac^1$ and $Ac^2$ groups in Formula I can be an unsubstituted or substituted 2-acenyl group having 2 to 4 fused benzene rings arranged in a rectilinear arrangement. These two groups can be the same or different. For example, the $Ac^1$ group can be 2-naphthyl and the $Ac^2$ group can be selected from 2-naphthyl, 2-anthracenyl, or 2-tetracenyl. In another example, the $Ac^1$ group can be 2-anthracenyl and the $Ac^2$ group can be selected from 2-anthracenyl or 2-tetracenyl. In yet another example, both of the $Ac^1$ and the $Ac^2$ group can be 2-tetracenyl.

The $Ac^1$ and $Ac^2$ groups can independently be unsubstituted or substituted with an alkyl, alkylthio, halo, haloalkyl, or combinations thereof. In some compounds according to Formula I, both the $Ac^1$ and the $Ac^2$ groups are unsubstituted. In other compounds according to Formula I, $Ac^1$ is unsubstituted and $Ac^2$ is substituted. In still other compounds according to Formula I, both $Ac^1$ and $Ac^2$ are substituted. A substituent can be located at any position of the acenyl group other than the 2-position. The substituents can often improve the compatibility of the 1,2-trans-bis(2-acenyl)ethylene compounds with various coating compositions.

Compounds with fused aromatic ring systems are commonly given a numbering sequence in which each carbon atom that is a member of only one ring is numbered. The various positions of 2-acenyl groups are shown in the following formulas for 2-naphthyl,

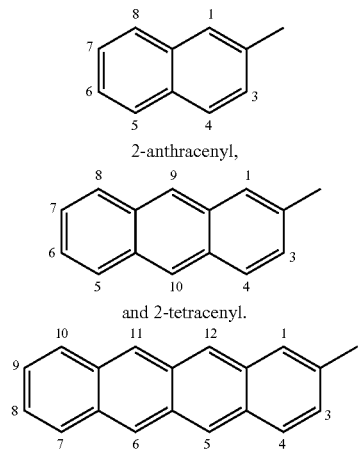

Some exemplary compounds according to Formula I have a substituent that is located on a benzene ring that is not adjacent to the ethylene group (i.e., the substituent is not in the 1-position, 3, position, or 4-position). For example, the substituent can be located on a benzene ring that is furthest from the 2-position. A 2-naphthyl or a 2-anthracenyl can be substituted at the 5-position, 6-position, 7-position, or 8-position; or a 2-tetracenyl can be substituted at the 7-position, 8-position, 9-position, or 10-position. Some compounds are substituted at multiple positions.

In some semiconductor layers, the compound according to Formula I is selected from unsubstituted or substituted trans-1,2-bis(2-naphthyl)ethylene; unsubstituted or substituted trans-1,2-bis(2-anthracenyl)ethylene; or unsubstituted or substituted trans-1,2-bis(2-tetracenyl)ethylene. Some exemplary semiconductor layers contain trans-1,2-bis(2-anthracenyl)ethylene that is unsubstituted or substituted with one or more substitutions selected from alkyl, alkoxy, alkylthio, halo, haloalkyl, or combinations thereof. Other exemplary semiconductor layers contain trans-1,2-bis(2-tetracenyl)ethylene that is unsubstituted or substituted with one or more substituents selected from alkyl, alkoxy, alkylthio, halo, haloalkyl, or combinations thereof.

The trans-1,2-bis(2-acenyl)ethylene compounds tend to form predominately one crystalline phase. For example, the compounds tend to have less than 10 weight percent, less than 5 weight percent, less than 2 weight percent, or less than 1 weight percent of a second crystalline phase.

Trans-1,2-bis(2-acenyl)ethylene compounds with identical acenyl groups can be prepared according to Reaction Scheme A by a Stille coupling reaction. A 2-halo-acene (i.e., Formula II where Ac is an acenyl group and X is a halo group) such as 2-chloro-acene or 2-bromo-acene can be reacted with a bis(trialkylstannyl)ethylene (i.e., Formula III where R is an alkyl group) to form a trans-1,2-bis(2-acenyl)ethylene (i.e., Formula IV). The Stille coupling reaction may be performed as outlined in A. F. Littke et al., *J. American Chem Soc.*, 124(22), 6343-6348 (2002). The reaction product Formula IV can be purified to a semiconductor grade material by any known process such as by vacuum sublimation.

Reaction Scheme A

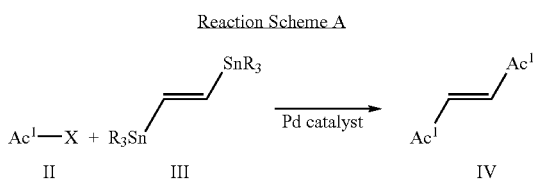

Other synthetic approaches can be used to prepare trans-1,2-bis(2-acenyl)ethylene compounds. For example, trans-1,2-bis(2-anthracenyl)ethylene can be prepared by reducing 1,2-bis(2-anthraquinoyl)ethylene as described in B. Becker et al., *J. Am. Chem. Soc.*, 113, 1121-1127 (1991). Alternatively, trans-1,2-bis(2-anthracenyl)ethylene can be prepared using the Wittig reaction of 2-anthracenyltriphenylphosphonium bromide and anthracene-2-carbaldehyde as described in Karatsu et al., *Chemistry Letters*, 1232-1233 (2001). Other trans-1,2-bis(acenyl)ethylene compounds can be prepared using similar reactions.

Trans-bis(2-acenyl)ethylene compounds having at least one substituent can be prepared by a Stille coupling of a ring-substituted 2-halo-acene (e.g., a ring-substituted 2-bromo acene or a ring-substituted 2-chloro acene) with a bis(trialkylstannyl)ethylene. Suitable ring-substituted 2-halo-acenes include, for example, ring-substituted 2-halo-naphthalene, ring-substituted 2-halo-anthracene, or ring-substituted 2-halo-tetracene where the halo is bromo or chloro. The ring-substituted 2-halo-acenes can be prepared by methods known in the art, and reference may be made to the synthetic schemes described in U.S. patent application Ser. Nos. 20030105365; U.S. patent application Ser. No. 10/620,027 filed on Jul. 15, 2003; and U.S. patent application Ser. No. 10/641,730 filed on Aug. 15, 2003, all of which are incorporated herein by reference.

Asymmetric trans-1,2-bis(acenyl)ethylene (i.e., a compound with different acenyl groups such as Formula IX) can be prepared, for example, through the use of coupling reactions such as the Wittig reaction as shown in Reaction Scheme B and further described, for example, in Trippett, *Quart. Rev.*, 17, 406 (1963)). An acene substituted with an alkyl bromide (i.e., Formula V) is reacted with triphenylphosphine to form a triphenylphosphonium salt (i.e., Formula VI). Exposure to a base forms the "ylide" (i.e., Formula VII) which can then react with an acene-2-carbaldehyde (i.e., Formula VIII) to form triphenylphosphonium oxide and the asymmetric trans-1,2-bis(2-acenyl)ethylene (i.e., Formula IX). As used herein, the term "asymmetric trans-1,2-bis(2-acenyl)ethylene compounds" refer to compounds of Formula I where $Ac^1$ is different than $Ac^2$.

Reaction Scheme B

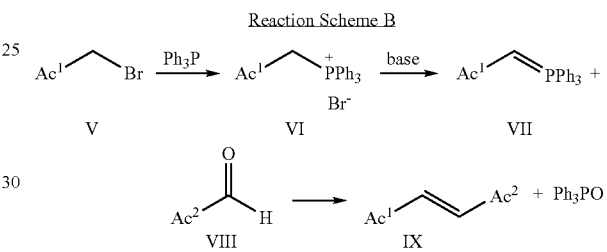

The semiconductor layer that contains a trans-1,2-bis(acenyl)ethylene compound can be included in any type of semiconductor device. Semiconductor devices have been described, for example, by S. M. Sze in *Physics of Semiconductor Devices*, $2^{nd}$ edition, John Wiley and Sons, New York (1981). Such devices include rectifiers, transistors (of which there are many types, including p-n-p, n-p-n, and thin-film transistors), photoconductors, current limiters, thermistors, p-n junctions, field-effect diodes, Schottky diodes, and the like.

Semiconductor devices can include components such as transistors, arrays of transistors, diodes, capacitors, embedded capacitors, and resistors that are used to form circuits. Semiconductor devices also can include arrays of circuits that perform an electronic function. Examples of these arrays, or integrated circuits, are inverters, oscillators, shift registers, and logic. Applications of these semiconductor devices and arrays include radio frequency identification devices (RFIDs), smart cards, displays backplanes, sensors, memory devices, and the like.

Each semiconductor device contains a semiconductor layer with a compound according to Formula I. The semiconductor layer can be combined with a conductive layer, a dielectric layer, or a combination thereof to form the semiconductor device. Semiconductor devices can be prepared or manufactured by known methods such as, for example, those described by Peter Van Zant in *Microchip Fabrication*, Fourth Edition, McGraw-Hill, New York (2000).

Some of the semiconductor devices are organic thin-film transistors. One embodiment of an organic thin-film transistor 10 is shown in FIG. 1a. The organic thin-film transistor (OTFT) 10 includes an optional substrate 12, a gate electrode 14 disposed on the optional substrate 12, a gate dielectric material 16 disposed on the gate electrode 14, an optional surface treatment layer 18 disposed on the gate dielectric layer 16, a source electrode 22, a drain electrode 24, and a semiconductor layer 20 that is in contact with both the source electrode 22 and the drain electrode 24. The source electrode 22 and the drain electrode 24 are separated from each other in an area on the surface of the semiconductor layer 20 (i.e., the source electrode 22 does not contact the drain electrode 24). The portion of the semiconductor layer that is positioned between the source electrode and the drain electrode is referred to as the channel 21. The channel is positioned over the gate electrode 14, the gate dielectric layer 16, and the optional surface treatment layer 18. The semiconductor layer 20 contacts the gate dielectric layer 16 or the surface treatment layer 18.

Figure 1B:
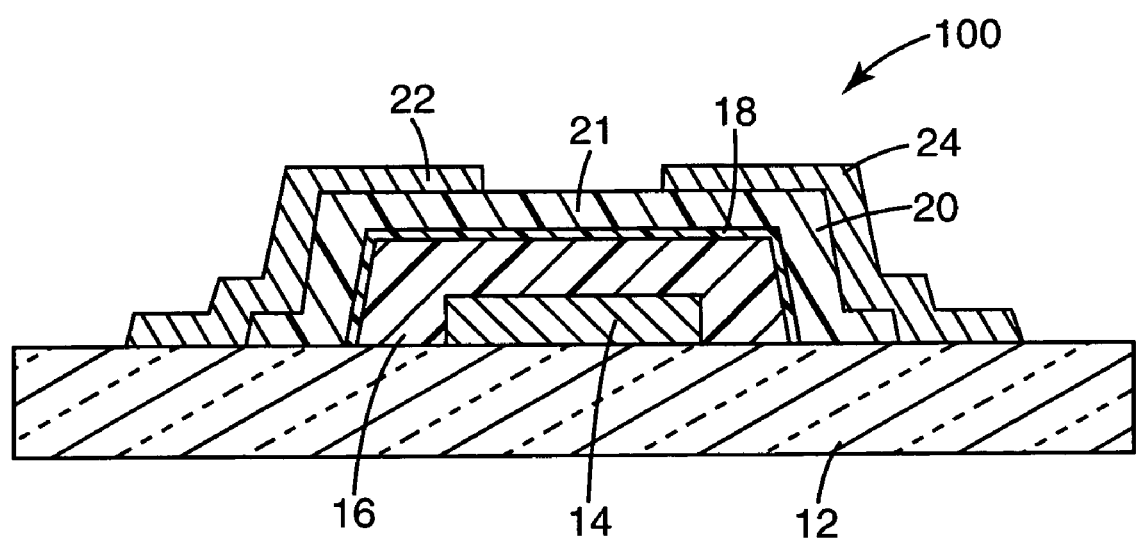

A second embodiment of an organic thin-film transistor is shown in FIG. 1*b*. This OTFT 100 includes a gate electrode 14 disposed on an optional substrate 12, a gate dielectric layer 16 disposed on the gate electrode 14, an optional surface treatment layer 18 disposed on the gate dielectric layer 16, a semiconductor layer 20, and a source electrode 22 and a drain electrode 24 disposed on the semiconductor layer 20. In this embodiment, the semiconductor layer 20 is between the gate dielectric layer 16 and both the source electrode 22 and the drain electrode 24. The semiconductor layer 20 can contact the gate dielectric layer 16 or the optional surface treatment layer 18. The source electrode 22 and the drain electrode 24 are separated from each other (i.e., the source electrode 22 does not contact the drain electrode 24) in an area on the surface of the semiconductor layer 20. The channel 21 is the portion of the semiconductor layer that is positioned between the source electrode 22 and the drain electrode 24. The channel 21 is positioned over the gate electrode 14, the gate dielectric layer 16, and the optional surface treatment layer 18.

In operation of the semiconductor device configurations shown in FIGS. 1*a* and 1*b*, voltage can be applied to the drain electrode 24. However, no charge (i.e., current) is passed to the source electrode 22 unless voltage is also applied to the gate electrode 14. That is, unless voltage is applied to the gate electrode 14, the channel 21 in the semiconductor layer 20 remains in a non-conductive state. Upon application of voltage to the gate electrode 14, the channel 21 becomes conductive and charge flows through the channel 21 from the source electrode 22 to the drain electrode 24.

A substrate 12 often supports the OTFT during manufacturing, testing, and/or use. Optionally, the substrate can provide an electrical function for the OTFT. For example, the backside of the substrate can provide electrical contact. Useful substrate materials include, but are not limited to, inorganic glasses, ceramic materials, polymeric materials, filled polymeric materials (e.g., fiber-reinforced polymeric materials), metals, paper, woven or non-woven cloth, coated or uncoated metallic foils, or a combination thereof. Suitable polymeric substrates include acrylics, epoxies, polyamides, polycarbonates, polyimides, polyketones, polynorbornenes, polyphenyleneoxides, poly(ethylene naphthalate), poly(ethylene terephthalate), poly(phenylene sulfide), poly(ether ether ketones) such as poly(oxy-1,4-phenyleneoxy-1,4-phenylenecarbonyl-1,4-phenylene), and the like.

The gate electrode 14 can include one or more layers of a conductive material. For example, the gate electrode can include a doped silicon material, a metal, an alloy, a conductive polymer, or a combination thereof. Suitable metals and alloys include, but are not limited to, aluminum, chromium, gold, silver, nickel, palladium, platinum, tantalum, titanium, or a combination thereof. Exemplary conductive polymers include, but are not limited to, polyaniline or poly(3,4-ethylenedioxythiophene)/poly(styrene sulfonate). In some organic thin film transistors, the same material can provide both the gate electrode function and the support function of the substrate. For example, doped silicon can function as both the gate electrode and as a substrate.

The gate dielectric layer 16 is disposed on the gate electrode 14. This gate dielectric layer 16 electrically insulates the gate electrode 14 from the balance of the OTFT device. Useful materials for the gate dielectric include, for example, an inorganic dielectric material, a polymeric dielectric material, or a combination thereof. The gate dielectric can be a single layer or multiple layers of suitable materials. Each layer in a single or multilayer dielectric can include one or more dielectric materials.

Exemplary inorganic dielectric materials include strontiates, tantalates, titanates, zirconates, aluminum oxides, silicon oxides, tantalum oxides, titanium oxides, silicon nitrides, barium titanate, barium strontium titanate, barium zirconate titanate, zinc selenide, zinc sulfide, hafnium oxides, and the like. In addition, alloys, combinations, and multiple layers of these materials can be used for the gate dielectric layer 16.

Exemplary polymeric dielectric materials include polyimides, parylene C, crosslinked benzocyclobutene, cyanoethylpullulan, polyvinyl alcohol, and the like. See, for example, C. D. Sheraw et al., "Spin-on polymer gate dielectric for high performance organic thin film transistors", *Materials Research Society Symposium Proceedings*, vol. 558, pages 403-408 (2000), Materials Research Society, Warrendale, Pa., USA; and U.S. Pat. No. 5,347,144 (Garnier).

Other exemplary organic polymeric dielectrics include cyano-functional polymers such as cyano-functional styrenic copolymers as disclosed in U.S. patent application Ser. No. 10/434,377, filed May 8, 2003, the disclosure of which is incorporated herein by reference. Some of these polymeric materials can be coated from solution, can be crosslinked, can be photo-patterned, can have high thermal stability (e.g., stable up to a temperature of about 250° C.), can have a low processing temperature (e.g., less than about 150° C. or less than about 100° C.), can be compatible with flexible substrates, or combinations thereof.

Exemplary cyano-functional polymers that can be used as organic dielectric materials include, but are not limited to, styrene maleic anhydride copolymers modified by adding a methacrylate functional group for crosslinking purposes and by attaching cyano-functional groups; the reaction product of bis(2-cyanoethyl)acrylamide with an acrylated polystyrene macromer; polymers formed from 4-vinylbenzylcyanide; polymers formed from 4-(2,2'-dicyanopropyl)styrene; polymers formed from 4-(1,1',2-tricyanoethyl)styrene; and polymers formed from 4-(bis-(cyanoethyl)aminoethyl)styrene; and a copolymer formed from 4-vinylbenzylcyanide and 4-vinylbenzylacrylate.

The organic thin film transistors can include an optional surface treatment layer 18 disposed between the gate dielectric layer 16 and at least a portion of the organic semiconductor layer 20. In some embodiments, the optional surface treatment layer 18 serves as an interface between the gate dielectric layer and the semiconductor layer. The surface treatment layer can be a self-assembled monolayer or a polymeric material.

Suitable self-assembled monolayer surface treatment layers are disclosed, for example, in U.S. Pat. No. 6,433,359 B1 (Kelley et al.). Exemplary self-assembled monolayers can be formed from 1-phosphono-2ethylhexane, 1-phosphono-2,4, 4-trimethylpentane, 1-phosphono-3,5,5-trimethylhexane, 1-phosphonoctane, 1-phosphonohexane, 1-phosphonohexadecane, 1-phosphono-3,7,11,5-tetramethylhexadecane, and the like.

Useful polymers and copolymers for a surface treatment layer are usually non-polar, glassy solids at room temperature. The polymeric materials in this layer typically have glass transition temperature ($T_g$) measured in the bulk of at least 25° C., of at least 50° C., or of at least 100° C. Suitable polymeric surface treatment layers are described, for example, in U.S. Patent Application Publication 2003/0102471 A1 (Kelley et al.) and U.S. Pat. No. 6,617,609 (Kelley et al.)

Exemplary polymeric surface treatment layers can contain polystyrene, polyfluorene, polynorbornene, poly(1-hexene), poly(methyl methacrylate), poly(acenaphthylene), poly(vinylnaphthalene), poly(butadiene), and poly(vinyl acetate). Other exemplary polymeric surface treatment layers can contain polymers or copolymers derived from α-methylstyrene, 4-tert-butylstyrene, 2-methylstyrene, 3-methylstyrene, 4-methylstyrene, 4-(phosphonomethyl)styrene, divinyl benzene, and combinations thereof. Examples of still other useful polymeric materials for the surface treatment layer include poly(dimethylsiloxane), poly(dimethylsiloxane-co-diphenylsiloxane), poly(methylphenylsiloxane-co-diphenylsiloxane), poly(dimethylsiloxane-co-methylphenylsiloxane), and the like.

The surface treatment layer often has a maximum thickness less than 400 Angstroms (Å). For example, the surface treatment layer can be less than 200 Å, less than 100 Å, or less than 50 Å. The surface treatment layer generally has a thickness of at least about 5 Å, at least about 10 Å, or at least 20 Å. The thickness can be determined through known methods such as ellipsometry.

The source electrode 22 and drain electrode 24 can be metals, alloys, metallic compounds, conductive metal oxides, conductive ceramics, conductive dispersions, and conductive polymers, including, for example, gold, silver, nickel, chromium, barium, platinum, palladium, aluminum, calcium, titanium, indium tin oxide (ITO), fluorine tin oxide (FTO), antimony tin oxide (ATO), indium zinc oxide (IZO), poly(3,4-ethylenedioxythiophene)/poly(styrene sulfonate), polyaniline, other conducting polymers, alloys thereof, combinations thereof, and multiple layers thereof. Some of these materials are appropriate for use with n-type semiconductor materials and others are appropriate for use with p-type semiconductor materials, as is known in the art.

The thin film electrodes (e.g., the gate electrode, the source electrode, and the drain electrode) can be provided by any means known in the art such as physical vapor deposition (for example, thermal evaporation or sputtering), ink jet printing, or the like. The patterning of these electrodes can be accomplished by known methods such as shadow masking, additive photolithography, subtractive photolithography, printing, microcontact printing, and pattern coating.

The trans-1,2-bis(acenyl)ethylene compounds tend to have a thermal stability that is comparable or superior to other known organic semiconductor material. For example, the trans-1,2-bis(acenyl)ethylene compounds can be heated in nitrogen to temperatures as high as 300° C., 325° C., 350° C., 375° C., or 400° C. and undergo a weight loss that is less than 10 weight percent, less than 5 weight percent, less than 2 weight percent, or less than 1 weight percent.

Further, the semiconductor devices that contain the trans-1,2-bis(acenyl)ethylene compounds tend to have performance characteristics such as charge-carrier mobility and current on/of ratio that are comparable to known organic semiconductor devices such as those that contain pentacene. For example, semiconductor devices can be prepared that have a charge mobility of about 1 $cm^2$/volt-sec, a threshold voltage of about −5 volts, a sub-threshold slope of about 1 to about 2 volts per decade, and on-off ratio greater than about $10^5$.

Methods of Preparing Semiconductor Devices

In another aspect, a method of preparing a semiconductor device is provided. The method involves preparing a semiconductor layer that contains a trans-1,2-bis(acenyl)ethylene compound of Formula I. The semiconductor layer is usually formed using a vapor deposition process.

In some exemplary methods of preparing a semiconductor device, the method involves preparing a semiconductor layer that contains a trans-1,2,-bis(acenyl)ethylene compound of Formula I; and depositing a dielectric layer, a conductive layer, or a combination thereof adjacent to the semiconductor layer. As used herein, the term "adjacent" refers to a first layer that is positioned near a second layer. The first layer often contacts the second layer but another layer could be positioned between the first and second layer. No specific order of preparing or depositing is necessary; however, the semiconductor layer is often prepared on the surface of another layer such as the dielectric layer, conductive layer, or a combination thereof.

One exemplary method of preparing a semiconductor device provides an organic thin film transistor. The method includes preparing a semiconductor layer that contains a trans-1,2-bis(acenyl)ethylene compound of Formula I; positioning a source electrode and a drain electrode on a surface of the semiconductor layer such that the source electrode and the drain electrode are separated in an area on the surface of the semiconductor layer (i.e., the source electrode does not contact the drain electrode). The method can further include providing a gate dielectric layer, a gate electrode, and an optional surface treatment layer.

More specifically, an organic thin film transistor can be prepared by providing a gate electrode; depositing a gate dielectric layer on a surface of the gate electrode; preparing a semiconductor layer adjacent to the gate dielectric layer (i.e., the gate dielectric is positioned between the gate electrode and the semiconducting layer); and positioning a source electrode and a drain electrode on a surface of the semiconductor layer that is opposite the gate dielectric layer. The source electrode and the drain electrode are separated from each other in an area on the surface of the semiconductor layer.

In one embodiment of this method, the various layers of the semiconductor device are arranged in the following order: gate electrode; gate dielectric layer; semiconductor layer; and a layer containing a source electrode and a drain electrode. In another embodiment, the various layers of the semiconductor device are arranged in the following order: gate electrode, gate dielectric layer, surface treatment layer, semiconductor layer, and a layer containing a source electrode and a drain electrode. The source electrode does not contact the drain electrode in these embodiments. That is, the source electrode and the drain electrode are separated from each other in an area on the surface of the semiconductor device. One surface of the semiconductor layer contacts both the source electrode and the drain electrode while the opposite surface of the semiconductor layer contacts the gate dielectric layer or the surface treatment layer.

The organic thin film transistor exemplified in FIG. 1b can be prepared by providing a substrate, depositing a gate electrode on the substrate, depositing a gate dielectric layer on a surface of the gate electrode such that the gate electrode is positioned between the substrate and the gate dielectric layer; applying a surface treatment layer to a surface of the gate dielectric layer opposite the gate electrode; preparing a semiconductor layer on a surface of the surface treatment layer opposite the gate dielectric layer; and positioning a source electrode and a drain electrode on a surface of the semiconductor layer that is opposite the polymeric treatment layer. The source electrode and the drain electrode are separated from each other in an area on the surface of the semiconductor layer. The area of separation between the source electrode and the drain electrode can define a channel in the semiconductor layer.

Another organic thin film transistor can be prepared by providing a gate electrode; depositing a gate dielectric layer on a surface of the gate electrode; positioning a source electrode and a drain electrode adjacent to the gate dielectric material such that the source electrode and the drain electrode are separated from each other in an area over the gate dielectric layer; preparing a semiconductor layer that is deposited on the source electrode, drain electrode, and in the area between the source electrode and the drain electrode. The semiconductor layer contacts both the source electrode and the drain electrode. The portion of the semiconductor layer that is positioned in the area between the source electrode and the drain electrode defines the channel.

In one embodiment of this method, the various layers of the semiconductor device are arranged in the following order: gate electrode; gate dielectric layer; a layer containing a source electrode and a drain electrode; and a semiconductor layer. In another embodiment, the various layers of the semiconductor device are arranged in the following order: gate electrode; gate dielectric layer; surface treatment layer; a layer containing a source electrode and a drain electrode; and semiconductor layer. The source electrode does not contact the drain electrode in these embodiments. A portion of the semiconductor layer can extend between the source electrode and the drain electrode.

The organic thin film transistor exemplified in FIG. 1a can be prepared by providing a substrate, depositing a gate electrode on the substrate, depositing a gate dielectric layer on a surface of the gate electrode such that the gate electrode is positioned between the substrate and the gate dielectric layer; applying a surface treatment layer to a surface of the gate dielectric layer opposite the gate electrode; positioning a source electrode and a drain electrode on a surface of the polymeric treatment layer such that the two electrodes are separated from each other in an area; preparing a semiconductor layer on the source electrode, drain electrode, and in the area between the source electrode and the drain electrode. The semiconductor layer contacts both the source electrode and the drain electrode. The portion of the semiconductor layer that is positioned in the area between the source electrode and the drain electrode defines a channel in the semiconductor layer.

The organic thin film transistors or other semiconductor devices such as integrated circuits can be prepared using flexible, repositionable polymeric aperture masks. The technique involve sequentially depositing material through a number of polymeric aperture masks formed with patterns that define layers, or portions of layers, of the semiconductor device. The use of such polymeric aperture masks are further described in U.S. Patent Publication Nos. 2003/0094959-A1, 2003/0150384-A1, 2003/0152691-A1, and 2003/0151118-A1, incorporated herein by reference.

Repositionable polymeric aperture masks often have a thickness of 5 to 50 micrometers or 15 to 35 micrometers. The various deposition apertures in the aperture masks usually have widths less than 1000 micrometers, less than 50 micrometers, less than 20 micrometers, less than 10 micrometers, or even less than 5 micrometers. Apertures of these sizes are particularly useful in creating small circuit elements for integrated circuits. Moreover, one or more gaps between deposition apertures are typically less than 1000 micrometers, less than 50 micrometers, less than 20 micrometers, or less than 10 micrometers, which is also useful in creating small circuit elements. The aperture masks can have a pattern with a width greater than 1 centimeter, 25 centimeters, 100 centimeters, or even 500 centimeters. Patterns having these widths can be useful in creating various circuits over a larger surface area.

Various laser ablation techniques may be used to facilitate the creation of polymeric aperture masks having patterns of deposition apertures. In addition, stretching techniques and other techniques may be used to facilitate alignment of flexible polymeric aperture masks. Furthermore, methods of controlling sag in aperture masks may be used which can be particularly useful in using masks that include a pattern that extends over a large width.

Other methods known in the art can be used to prepare the semiconductor devices. These methods include, for example, metal shadow masks; photolithography and/or etching; and printing methods such as inkjet, screen printing, gravure printing, and the like.

In some methods that involve the use of aperture masks, semiconductor devices (e.g., integrated circuits) can be created solely using aperture mask deposition techniques, without requiring any of the etching or photolithography steps typically used to form such devices. The techniques can be particularly useful in creating circuit elements for electronic displays such as liquid crystal displays and low-cost integrated circuits such as radio frequency identification (RFID) circuits. In addition, such techniques can be advantageous in the fabrication of integrated circuits incorporating organic semiconductors, which typically are not compatible with photolithography or other wet chemical processes.

EXAMPLES

Objects and advantages of this invention are further illustrated by the following examples, but the particular materials and amounts thereof recited in these examples, as well as other conditions and details, should not be construed to unduly limit this invention.

Anhydrous N,N-dimethylformamide (DMF), anhydrous 1,4-dioxane, anhydrous chlorobenzene, cyclohexanol, and aluminum tri-sec-butoxide were purchased from Aldrich (Milwaukee, Wis.).

$Pd_2(dba)_3$ (dba=dibenzylideneacetone), tetrakis(triphenylphosphine)palladium(0) $(Pd(PPh_3)_4)$, tri-t-butylphosphine $(P(t-Bu)_3)$ (10 weight percent in hexanes), and CsF were purchased from Strem Chemicals (Newburyport, Mass.). Cesium fluoride (CsF) was ground to a fine powder, dried under vacuum at 100° C. for several hours, and stored in a dry box.

Trans-1,2-bis(tri-n-butylstannyl)ethylene, 4-bromophthalic anhydride, and 2,3-naphthalic anhydride were purchased from TCI America (Portland, Oreg.).

Trifluoromethanesulfonic acid (triflic acid) was obtained from 3M Company (St. Paul, Minn.) under the trade designation "FLUORORAD FC 24".

Trifluoromethanesulfonic anydride was purchased from Matrix Scientific (Columbia, S.C.).

Preparatory Example 1

Synthesis of 2-bromoanthracene (Formula XIII)

2-bromoanthracene (Formula XIII) was prepared as shown in Reaction Scheme C.

Reaction Scheme C

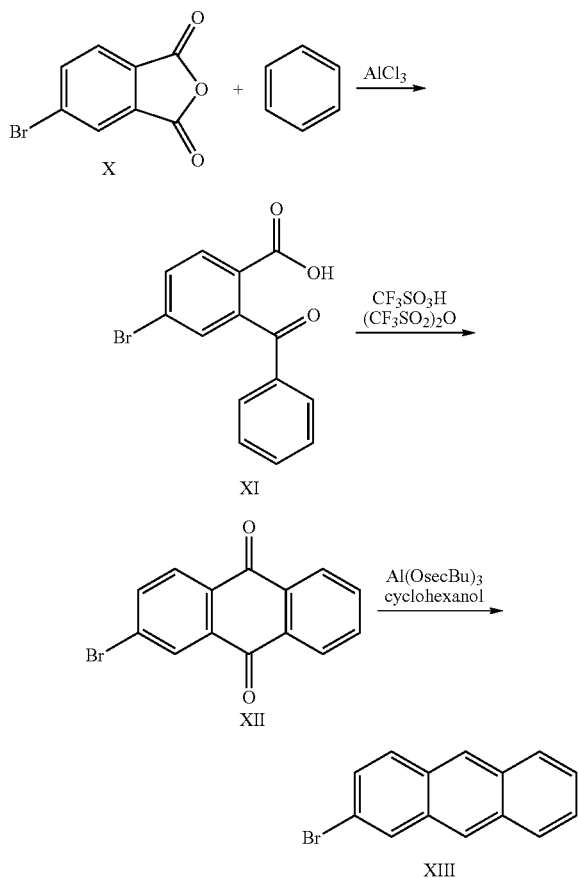

2-benzoyl-4(5)-bromobenzoic acid (Formula XI)

A 1 L, 3-necked flask was charged with benzene (300 mL) and $AlCl_3$ (73.4 g). The suspension was cooled with an ice water bath and 4-bromophthalic anhydride (Formula X, 50 g) was gradually added. The mixture was heated to 65° C. for 4 h, then poured into a large beaker containing 1500 mL of crushed ice. The solution was stirred and mixed with diethyl ether (1 L) and concentrated hydrochloric acid (HCl) (100 mL) to dissolve all solids. The organic phase was separated and washed three times with 200 mL brine, dried with $MgSO_4$, and filtered. The volatiles were stripped under reduced pressure and the solid was dried under vacuum overnight to afford 60.0 g (89 percent yield) of white product. DSC data: 144° C., 169° C. (unresolved peaks), $\Delta H=139$ $Jg^{-1}$. $^1H$ NMR spectrum shows a complex series of multiplets from ca. 7.4-8.2 ppm. A molecular ion at 306 Daltons is observed in the electron impact mass spectrum (EIMS).

2-bromoanthraquinone (Formula XII)

2-Benzoyl-4(5)-bromobenzoic acid (Formula XI, 11.2 g) was gradually added to a stirred solution of trifluoromethanesulfonic acid (80 mL) and trifluoromethanesulfonic anhydride (9.2 mL). The red mixture was stirred at 75° C. for 4 hours, then cooled and poured into 300 mL of crushed ice. The off-white solid was collected on a filter frit (25-50 μm pores), washed four times with 100 mL water, and dried under vacuum to afford 9.84 g (94 percent yield) of product. DSC data (scanned at 20° C./min): peak temp of 210° C. ($\Delta H=173$ $Jg^{-1}$); lit. melting point values are in the range 204° C. to 211° C. Spectroscopic data (IR, NMR) are consistent with other literature values. IR (KBr pressed pellet): $v_{CO}=1678$ $cm^{-1}$.

2-bromoanthracene (Formula XIII)

2-bromoanthraquinone (Formula XII, 35.2 g) was added to a 3-L, 3-necked flask fitted with a distillation head and receiver. The system was put under $N_2$ and charged with cyclohexanol (1 L), and $Al(O-sec-Bu)_3$ (375 mL). The mixture was heated until distillate began collecting in the receiver at a pot temperature of about 120° C. The distillation was continued until the pot temperature reached 162° C., and then cooled to 155° C. The reaction was stirred at 155° C. over 48 h, then cooled to 100° C. and poured into a large beaker containing methanol (MeOH) (1 L), water (400 mL) and concentrated HCl (200 mL). The off-white precipitate was collected on a filter frit (40-60 μm pores), washed with water (30 mL) and MeOH (1 L), and air-dried overnight. The product was dried further under vacuum to afford 22.4 g (71 percent yield). DSC data (scanned at 20° C./min): peak temp 220° C., $\Delta H=126$ $Jg^{-1}$. IR (KBr, strong abs only): 892, 741, 474 $cm^{-1}$. $^1H$ NMR (500 MHz, $d_6$-$Me_2SO$): δ 7.56 (m, 6 lines, 6-H, 8-H), 7.60 (dd, J=2.0 9.0 Hz, 7-H), 8.09 (m, 1-H, 3-H, 4-H), 8.39 ('d', J=1 Hz, 9-H), 8.57 (s, 5-H), 8.63 (s, 10-H).

Preparatory Example 2

Synthesis of 2-chlorotetracene (Formula XVII)

2-chlorotetracene (Formula XVII) was prepared as shown in Reaction Scheme D.

Reaction Scheme D

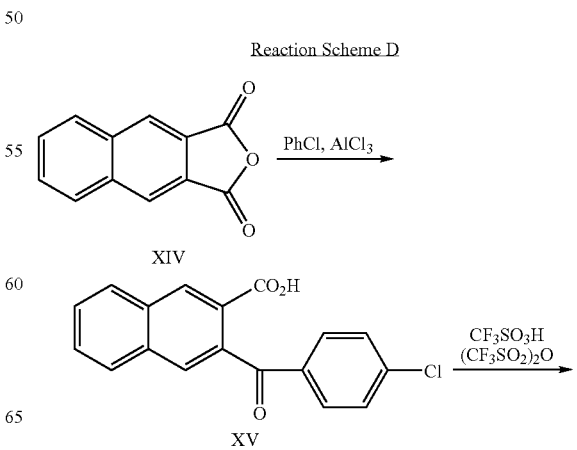

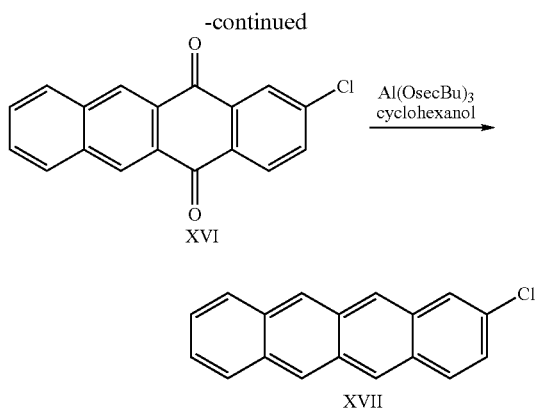

3-(4-chlorobenzoyl)-naphthalene-2-carboxylic acid (Formula XV)

A 500 mL, 3-necked flask fitted with a water condenser and gas adapter, was purged with nitrogen, and charged with AlCl$_3$ (61 g) and chlorobenzene (400 mL). The mixture was cooled with an ice water bath and 2,3-naphthalic anhydride (Formula XIV, 40.9 g) was gradually added. The mixture was heated at 65° C. for 4.5 hours, and turned deep red. The solution was poured into a 4 L beaker containing 1 L of crushed ice, followed by concentrated HCl (100 mL), ethyl acetate (1 L), and diethyl ether (500 mL). The organic phase was separated from the aqueous phase and split into three equal portions. Each portion was successively extracted with 300 mL of 0.3 M NaOH (aq) and then 225 mL of 0.2 M NaOH (aq). The combined basic extracts from all portions (about 1.6 L) was stirred rapidly with crushed ice and acidified by adding concentrated HCl dropwise until the pH was 1. The precipitate that formed was isolated on a filter frit and air dried overnight to afford 53.8 g (84 percent yield) of white product. Mass spectrometry of a methylated sample showed the desired product accounting for more than 99 percent of the total ion current. No de-chlorinated product was detected as an impurity. $^1$H NMR (400 MHz, d$_6$-Me$_2$SO): δ 7.58 ('dt' J=2.0, 8.8 Hz, 2H), 7.70 ('dt', J=1.6, 8.4 Hz, 2H), 7.75 (m, 2H), 8.05 (s, 1H), 8.10 (m, 1H), 8.23 (m, 1H), 8.67 (s, 1H).

2-chloro-5,12-tetracenequinone (Formula XVI)

A 500 mL flask was successively loaded with trifluoromethanesulfonic acid (175 mL), 3-(4-chlorobenzoyl)-naphthalene-2-carboxylic acid (Formula XV, 25.5 g), and trifluoromethanesulfonic anhydride (21 mL). The mixture was heated at 155° C. for 10 hours. The violet-blue solution was gradually poured into a 2 L beaker containing 1 L of crushed ice. Additional ice was added as necessary to keep the solution cold. The brown-green mixture was poured onto a large 25-50 μm glass frit, and the isolated solid was washed with water (1 L), methanol (300 mL), and then air-dried overnight. The crude material was purified by high vacuum train sublimation (less than 10$^{-3}$ Torr) at a source temperature of 165° C. to afford 17.5 g (73 percent yield) of bright yellow product. $^1$H NMR (400 MHz, d$_6$-DMSO): δ 8.89 ('s', 6-H and 11-H), 8.36 (m, 4 lines, J=3.2 Hz, 7-H and 10-H), 8.30 ('d', J=8 Hz, 4-H), 8.22 ('d', 2 Hz, 1-H), 8.02 ('dd', J=2 Hz, 4 Hz), 7.82 (m, 4 lines, J=3.2 Hz, 8-H and 9-H).

2-chlorotetracene (Formula XVII)

A 3-necked, 2 L round-bottomed vessel was fitted with a distillation head and receiver, and purged with nitrogen. 2-chloro-5,12-tetracenequinone (Formula XVI, 20 g), cyclohexanol (400 mL), and Al(O-sec-Bu)$_3$ (210 mL) were successively charged. The mixture was heated until distillate began collecting in the receiver at a pot temperature of about 120° C. The distillation was continued until the pot temperature reached 162° C., and then cooled to 155° C. A bright orange precipitate formed as the reaction stirred at 155° C. over 72 hours. The mixture was cooled to 120° C., and gradually poured into a stirred mixture of methanol (350 mL), water (200 mL), and concentrated HCl (100 mL). A bright orange solid was isolated on a 25-50 μm glass frit, washed twice with 200 mL methanol, and dried under vacuum overnight. The crude material (12.1 g) was purified by vacuum train sublimation at 4×10$^{-6}$ Torr and a source temperature of 260° C. to afford 11.4 g (64%) of bright orange product. DSC (under nitrogen, scanned at 20° C./min): 361° C. (ΔH=96 Jg$^{-1}$, decomp). EIMS: 262 ([M]+, 100%), 226 ([M−HCl]+, 23%). Anal. Calcd. for C$_{18}$H$_{11}$Cl: C, 82.3; H, 4.22. Found: C, 82.5; H, 4.27.

Example 1

Synthesis of trans-1,2-bis(2-anthracenyl)ethylene (Formula I where both Ac$^1$ and Ac$^2$ are anthracenyl)

Under a nitrogen atmosphere, a vessel was successively charged with Pd(PPh$_3$)$_4$ (58 mg), 2-bromoanthracene (Formula XIII, 857 mg), dry DMF (20 mL), and trans-1,2-bis(tri-n-butylstannyl)ethylene (1.01 g). The mixture was warmed with an 84° C. oil bath and became clear yellow. A yellow precipitate formed in the mixture as it was stirred overnight. The vessel was cooled and the solids were collected on a glass filter frit (10-20 μm pores), washed three times with water (25 mL), and air-dried overnight. The crude product was train sublimed under vacuum (10$^{-5}$-10$^{-6}$ Torr) at a source temperature of 275° C. A bright yellow product (470 mg, 74% yield) was collected from the middle zone (200° C.). The material was sublimed a second time (greater than 90 percent recovery) prior to device fabrication.

Analysis of the synthesized material by thermal desorption electron ionization mass spectroscopy (EIMS) was completed using a Micromass QuatroII triple quadrupole mass spectrometer. A few micrograms of a sample were placed into a quartz sample vial that was heated from 50-650° C. over 15 minutes. The mass spectrometer was tuned to unit mass resolution and scanned from m/z 100 to 620 amu. The positive ion mass spectrum showed evidence for the desired product only (380 amu).

Figure 2:
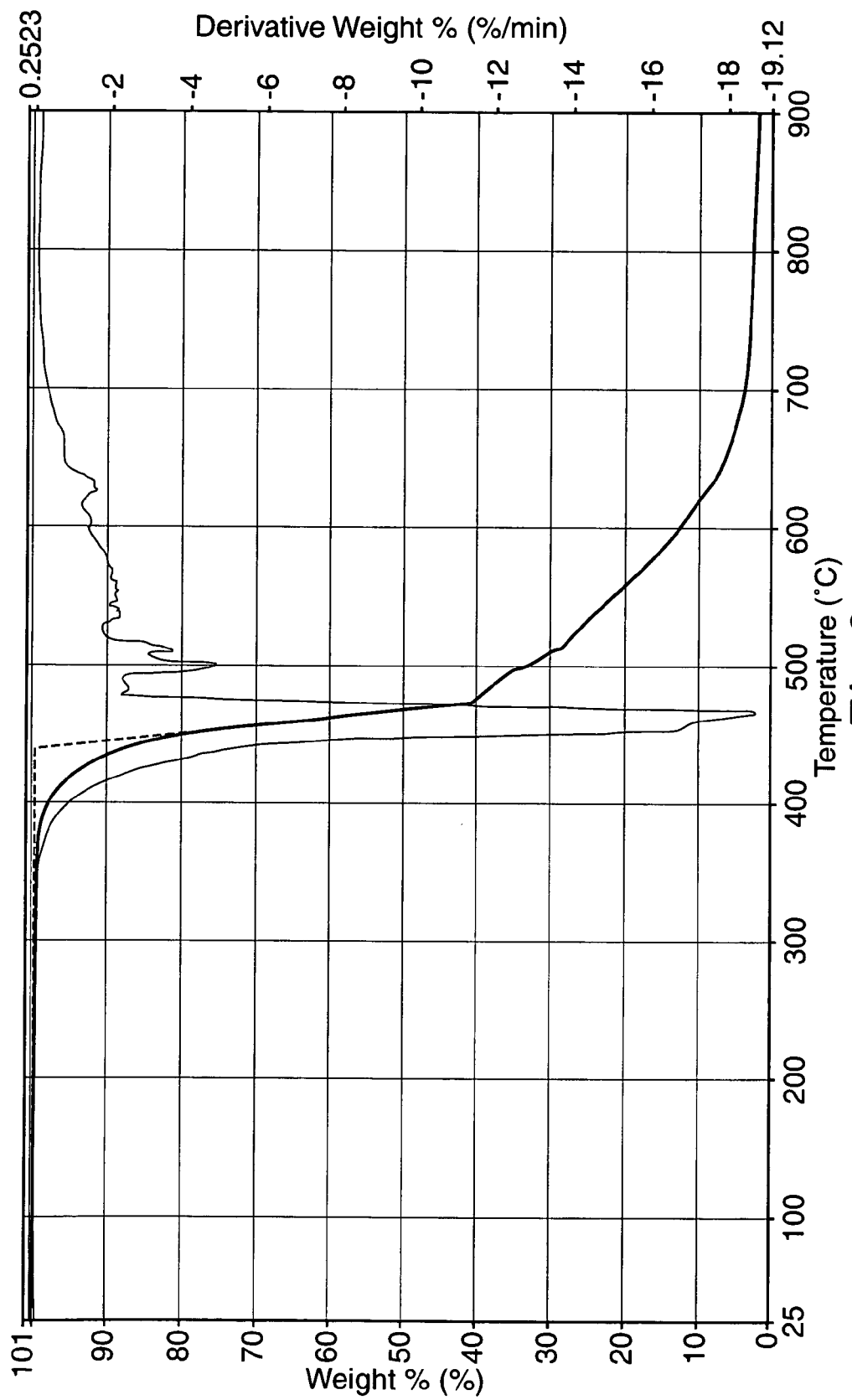
FIG. 2 is a plot showing the weight loss of trans-1,2-bis(2-anthracenyl)ethylene as a function of temperature.

FIG. 2 shows a plot of thermal gravimetric analysis (TGA) data obtained for a sample of trans-1,2-bis-(2-anthracenyl)ethylene powder. The experiment was run under a nitrogen atmosphere and scanned from 25° C. to 900° C. at 10° C./min. The plotted data shows that the material is stable up to about 400° C.

Figure 3:
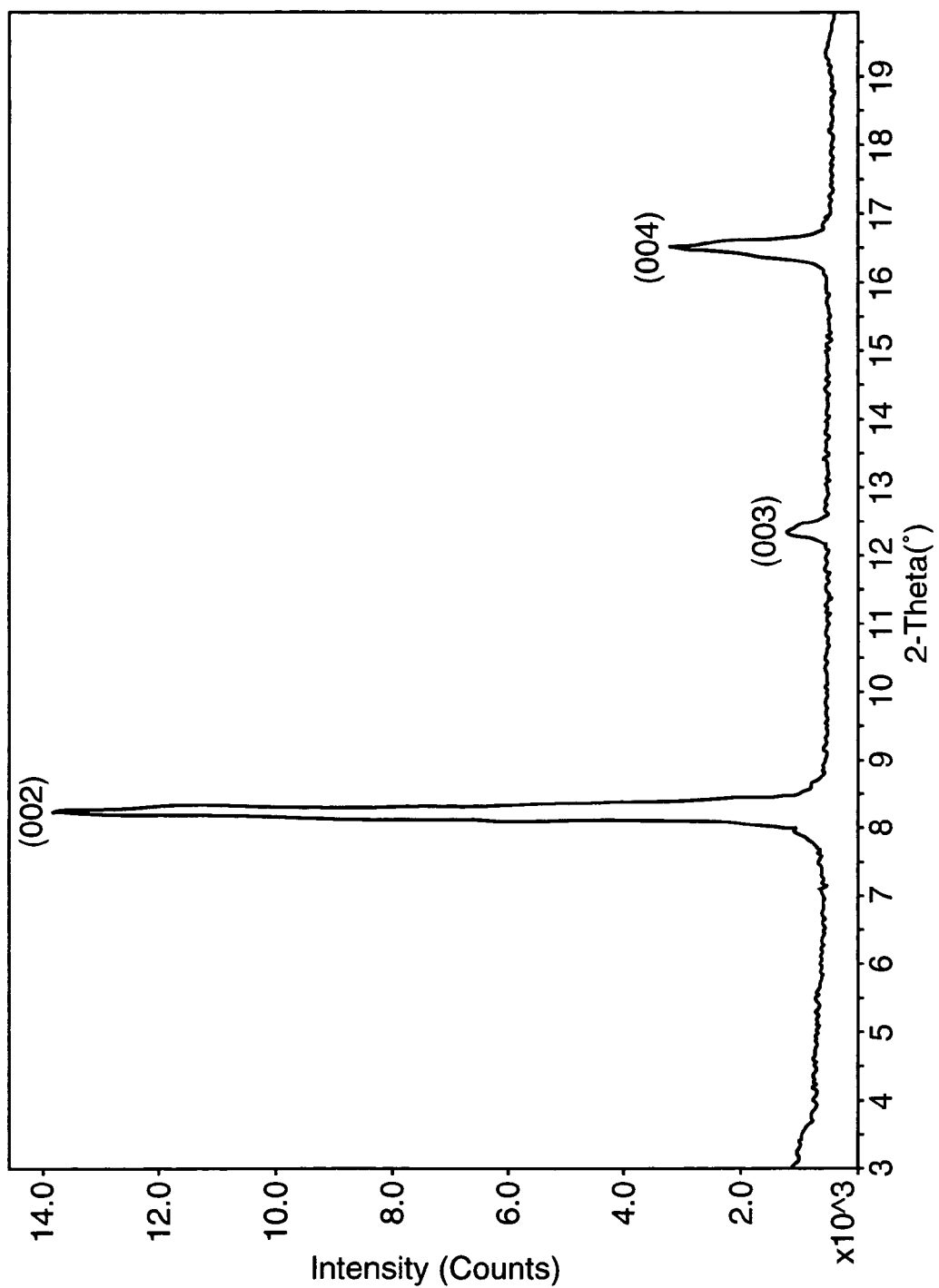
FIG. 3 shows the X-ray diffraction pattern of trans-1,2-bis(2-anthracenyl)ethylene vapor-deposited on a poly(α-methylstyrene)-coated $SiO_2$ substrate.

Thin films (e.g., thickness of about 30 nm) of trans-1,2-bis(2-anthracenyl)ethylene were vapor deposited and analyzed using X-ray diffraction (Cu Kα radiation). Reflection geometry survey scans were collected by use of a Philips vertical diffractometer, and proprotional detector registry of the scattered radiation. The diffractometer was fitted with variable incident beam slits, fixed diffracted beam slits, and graphite diffracted beam monochromator. The survey scans were conducted from 3 to 40 degrees (2θ) using a 0.04 degree step size and 6 second dwell time. X-ray generator settings of 45 kV and 35 mA were employed. A representative diffraction pattern of trans-1,2-bis(2-antracenyl)ethylene adsorbed on a poly(α-methyl styrene) (AMS) coated $SiO_2$ substrate is shown in FIG. 3. The sample had a series of (001) reflections that are consistent with a lamellar structure. The interlayer spacing of 24.5 Å corresponds closely to the extended molecular length, and suggests that the molecules are oriented about perpendicular to the substrate plane. No significant difference was observed between samples that were prepared on alumina or silica dielectric films, either with or without a polymeric surface treatment. For all substrates, the even order layer lines produced significantly more intensity than the odd order maxima.

Example 2

Synthesis of trans-1,2-bis(2-tetracenyl)ethylene (Formula I where $Ac^1$ and $Ac^2$ are tetracenyl)

Under nitrogen, a 100 mL vessel was successively charged with $Pd_2(dba)_3$ (45 mg), CsF (1.1 g), 1,4-dioxane (30 mL), trans-1,2-bis(tri-n-butylstannyl)ethylene (975 mg), 2-chlorotetracene (Formula XVII, 840 mg), and $P(t-Bu)_3$ (0.6 mL of 10 wt % hexanes solution). The mixture was stirred and purged through with a nitrogen stream for 30 min. The mixture was stirred and heated with an oil bath (85° C.) for 3 days, cooled, and poured through a 10-15 μm filter frit to isolate a deep red precipitate. The material was washed with 25 mL of water and air dried overnight. Vacuum train sublimation at $1 \times 10^{-4}$ Torr and a source temp of 475° C. afforded 218 mg (10 percent yield) of red product. From the coolest zone of the sublimation was isolated 215 mg of 2-chlorotetracene starting material (26 percent of the reactant), indicating that the reaction conditions were not optimized.

A sample of the product was suspended in THF and mixed with a solution of 2-(4-hydroxyphenylazo)benzoic acid (HABA). Matrix assisted laser desorption ionization mass spectra were recorded using an Applied Biosystems Voyager DE STR MALDI/TOF instrument operated in the reflection mode. A molecular species was detected at 480 Da.

Example 3

Device Preparation and Testing

Test transistors were made on a single crystal <100> orientation heavily-doped p-type or n-type silicon wafers that were obtained from Silicon Valley Microelectronices (San Jose, Calif.). A 1500 Å layer of sputtered alumina or a 1000 Å layer of high temperature thermal silicon oxide was deposited on each wafer. A 5000 Å layer of aluminum metal was vapor deposited onto the backside of each wafer. In this configuration, the doped wafer capped with aluminum served as the gate electrode and the alumina or silicon oxide functioned as the gate dielectric when organic thin film transistors (OTFTs) were prepared.

Figure 4A:
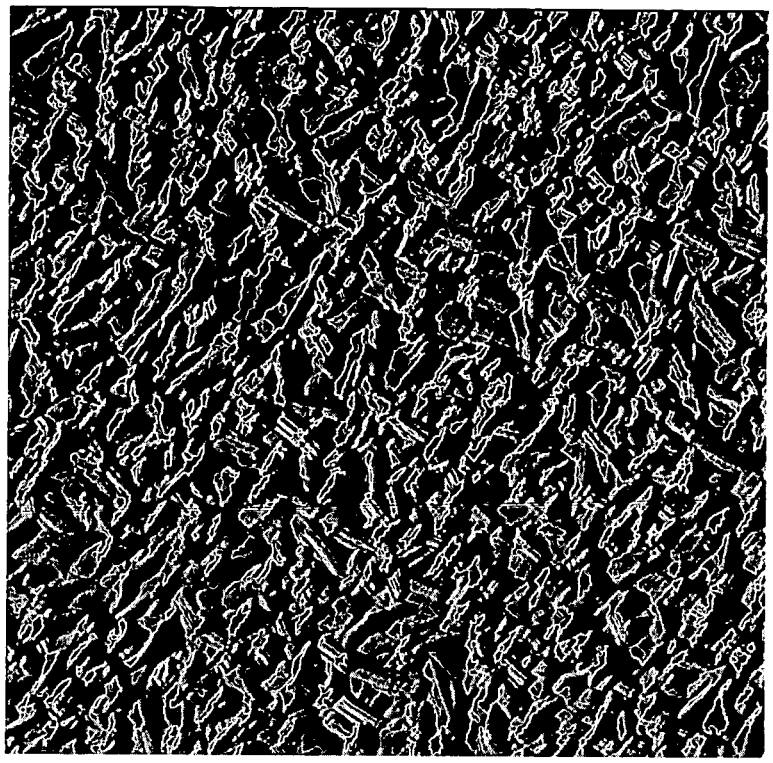
FIGS. 4a and 4b are atomic force micrographs (AFM) of evaporated thin films (e.g., 30 nm thick) of trans-1,2-bis(2-anthracenyl)ethylene showing areas of 100 μm² and 6.25 μm², respectively.
Figure 4B:
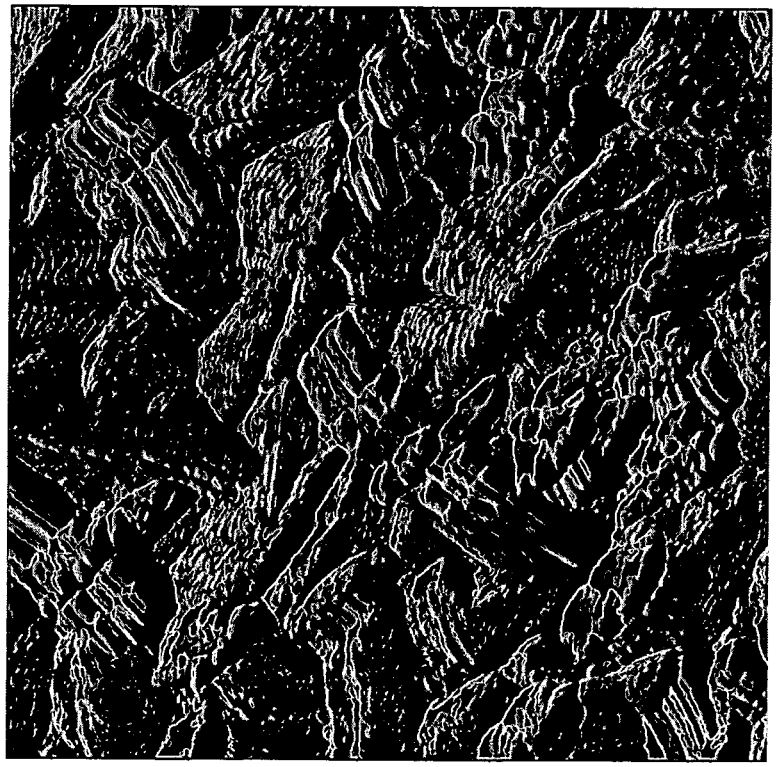

For the polymeric surface-treated samples, an alumina wafer substrate was quartered, and poly(α-methylstyrene) (AMS) coating was applied by spin coating (300 rpm/5 sec, then 2000 rpm/15 sec) a toluene solution of the polymer. The samples were were heated in an oven for 30 minutes at 110° C. The semiconductor layer of 1,2-bis(2-anthracenyl)ethylene (Formula I where $Ac^1$ and $Ac^2$ are anthracenyl) was deposited by vacuum sublimation ($10^{-6}$ Torr) onto each of the four substrates at a rate of 0.3 Å/sec to reach a thickness of 300 Å (30 nm) as measured using atomic force microscopy. Atomic force micrographs of 30 nm thick layer of trans-1,2-bis(2-anthracenyl)ethylene on poly(alpha-methylstyrene)-coated $SiO_2$ are shown in FIGS. 4a (i.e., corresponding to an area of 100 μm$^2$) and 4b (i.e., corresponding to an area of 6.25 μm$^2$).

Gold source and drain electrodes were evaporated through a shadow masked onto the semiconductor layer. The devices had a channel length of 60 to 100 μm and a channel width of 1000 μm.

Figure 5:
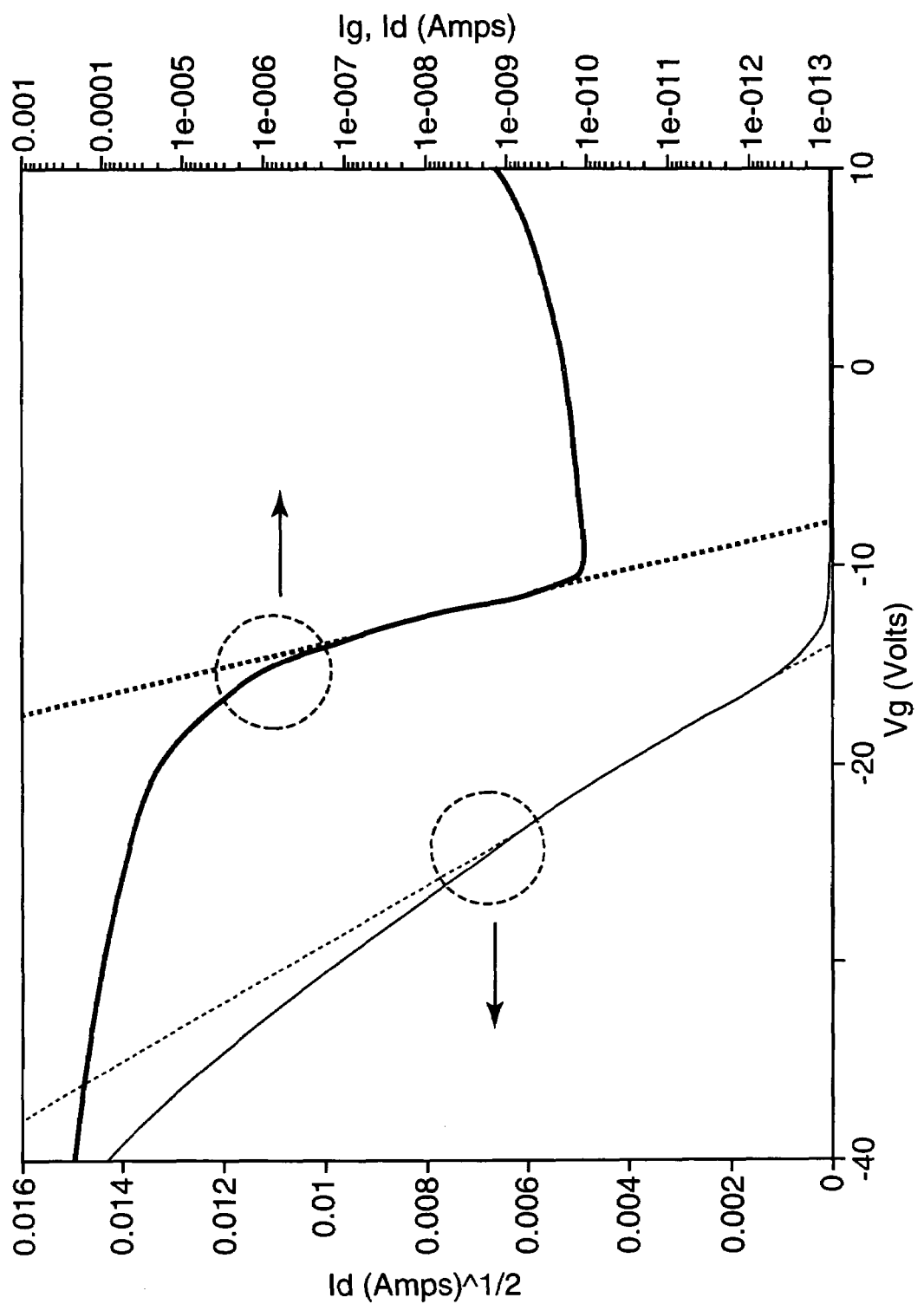
FIG. 5 shows performance data for an exemplary organic thin film transistors having a semiconductor layer that contains trans-1,2-bis(2-anthracenyl)ethylene.

Transistor performance was tested at room temperature in air using techniques known in the art. A Semiconductor Parameter Analyzer (Model 4145A from Hewlett-Packard, Palo Alto, Calif.) was used for the testing. The square root of the drain current ($I_d$) was plotted as a function of gate-source bias ($V_g$), from +10 to −40 V for a constant source-drain bias ($D_{VD}$) of −40 V. The saturation field effect mobility was calculated from the linear portion of the curve using the specific capacitance of the gate dielectric, the channel width and the channel length. The x-axis extrapolation of this straight-line fit was taken as the threshold voltage ($V_t$). In addition, plotting $I_d$ as a function of $V_g$ yielded a curve where a straight line fit was drawn along a portion of the curve containing $V_t$. The inverse of the slope of this line was the sub-threshold slope (S). The on-off ratio was taken as the difference between the minimum and maximum drain current ($I_d$) values of the $I_d$-$V_g$ curve. FIG. 5 shows a representative performance data for trans-1,2-bis (2-anthracenyl)ethylene OTFTs constructed as described above on a AMS-$Al_2O_3$ substrates. The charge-carrier mobility was 1.0 cm$^2$/Vs, the current on/off ratio was $2 \times 10^6$, the sub-threshold slope was 0.97 volts per decade, and the threshold voltage was −14 V.

We claim:

1. A semiconductor device comprising a semiconductor layer comprising a trans-1,2-bis(acenyl)ethylene compound of Formula I

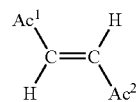

I wherein
Ac$^1$ and Ac$^2$ are each independently a 2-acenyl selected from 2-naphthyl, 2-anthracenyl, or 2-tetracenyl, said 2-acenyl being unsubstituted or substituted with an alkyl, alkoxy, alkylthio, halo, haloalkyl, or a combination thereof.

2. The semiconductor device of claim 1, wherein the Ac$^1$ and Ac$^2$ groups are identical.

3. The semiconductor device of claim 1, wherein the Ac$^1$ and Ac$^2$ groups are unsubstituted.

4. The semiconductor device of claim 1, wherein the compound of Formula I is substituted or unsubstituted trans-1,2-bis(2-naphthyl)ethylene; substituted or unsubstituted trans-1,2-bis(2-anthracenyl)ethylene; or substituted or unsubstituted trans-1,2-bis(2-tetracenyl)ethylene.

5. The semiconductor device of claim 1, wherein the compound of Formula I is substituted or unsubstituted trans-1,2-bis(2-anthracenyl)ethylene.

6. The semiconductor device of claim 1, wherein the compound of Formula I is trans-1,2-bis(2-anthracenyl)ethylene.

7. The semiconductor device of claim 1, further comprising a conducting layer, a dielectric layer, or a combination thereof adjacent to the semiconductor layer.

8. The semiconductor device of claim 1, wherein said semiconductor device comprises an organic thin film transistor.

9. The semiconductor device of claim 1, further comprising a source electrode and a drain electrode in contact with the semiconductor layer, wherein the source electrode and the drain electrode are separated by an area on the surface of the semiconductor layer.

10. The semiconductor device of claim 1, further comprising a conducting layer adjacent to one surface of the semiconducting layer and a dielectric layer adjacent to an opposite surface of the semiconducting layer.

11. A compound of formula

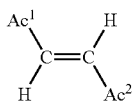

wherein
Ac$^1$ and Ac$^2$ are each independently a 2-tetracenyl that is unsubstituted or substituted with an alkyl, alkoxy, alkylthio. halo, haloalkyl, or a combination thereof.

12. A method of preparing a semiconductor device, said method comprising preparing a semiconductor layer comprising a trans-1,2-bis(acenyl)ethylene compound of Formula I

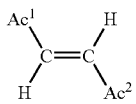

wherein
Ac$^1$ and Ac$^2$ are each independently a 2-acenyl selected from 2-naphthyl, 2-anthracenyl, or 2-tetracenyl, said 2-acenyl being unsubstituted or substituted with an alkyl, alkoxy, alklthio, halo, haloalkyl or a combination thereof.

13. The method of claim 12, further comprising depositing a second layer adjacent to the semiconductor layer, said second layer being a conducting layer or a dielectric layer.

14. The method of claim 12, wherein the compound of Formula I is substituted or unsubstituted trans-1,2-bis(2-naphthyl)ethylene; substituted or unsubstituted trans-1,2-bis(2-anthracenyl)ethylene; or substituted or unsubstituted trans-1,2-bis(2-tetracenyl)ethylene.

15. The method of claim 14, wherein the compound of Formula I is substituted or unsubstituted trans1,2-bis(2-antracenyl)ethylene.

16. A method of preparing an organic thin film transistor, said method comprising:
providing a gate electrode;
depositing a gate dielectric layer on a surface of the gate electrode;
preparing a semiconductor layer adjacent to the gate dielectric layer opposite the gate electrode, said semiconductor layer comprising a trans-1,2-bis(acenyl)ethylene compound of Formula I

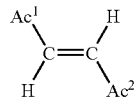

wherein
Ac$^1$ and Ac$^2$ are each independently a 2-acenyl selected from 2-naphthyl, 2-anthracenyl, or 2-tetracenyl, said 2-acenyl being unsubstituted or substituted with an alkyl, alkoxy, alkylthio, halo, haloalkyl, or a combination thereof; and
positioning a source electrode and a drain electrode on a surface of the semiconductor layer that is opposite the gate dielectric layer, wherein the source electrode and the drain electrode are separated from each other in an area on the surface of the semiconductor layer.

17. The method of claim 16, further comprising depositing a surface treatment layer between the gate dielectric layer and the semiconductor layer.

18. The method of claim 16, wherein the compound of Formula I is substituted or unsubstituted trans-1,2-bis (2naphthyl)ethylene; substituted or unsubstituted traits 1,2-bis(2anthracenyl)ethylene; or substituted or unsubstituted trans-1,2-bis(tetracenyl)ethylene.

19. A method of preparing an organic thin film transistor, said method comprising:
providing a gate electrode;
depositing a gate dielectric layer on a surface of the gate electrode;
positioning a source electrode and a drain electrode adjacent to the gate dielectric layer opposite the gate electrode, wherein the source electrode and the drain electrode are separated by an area over the gate dielectric layer;
preparing a semiconductor layer on a surface of the source electrode, on the surface of the drain electrode, and in the area between the source electrode and the drain electrode, said semiconductor layer comprising a trans-1,2-bis(acenyl)ethylene compound of Formula I

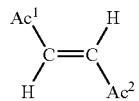

wherein
Ac$^1$ and Ac$^2$ are each independently a 2-acenyl selected from 2-naphthyl, 2-anthracenyl, or 2-tetracenyl, said 2-acenyl being unsubstituted or substituted with an alkyl, alkoxy, alkylthio, halo, haloalkyl, or a combination thereof.

20. The method of claim 19, said method further comprising depositing a surface treatment layer that contacts he surface of the gate dielectric layer opposite the gate electrode.

21. The method of claim 19, wherein compound of Formula I is substituted or unsubstituted trans-1,2-bis(2-naphthyl)ethylene; substituted or unsubstituted trans-1,2-bis-(2-anthracenyl)ethylene; or substituted or unsubstituted trans-1,2-bis(tetracenyl)ethylene.

* * * * *

UNITED STATES PATENT AND TRADEMARK OFFICE
CERTIFICATE OF CORRECTION

PATENT NO. : 7,315,042 B2
APPLICATION NO. : 10/991562
DATED : January 1, 2008
INVENTOR(S) : Christopher P. Gerlach It is certified that error appears in the above-identified patent and that said Letters Patent is hereby corrected as shown below:

Page 2 Column 2 (Other Publications),
Line 18, delete "Equllibria" and insert -- Equilibria --, therefor.

Column 6,
Line 12, delete "(1963))." and insert -- (1963). --, therefor.

Column 13,
Line 1, delete "anydride" and insert -- anhydride --, therefor.

Column 14,
Line 39, delete "2.0 9.0" and insert -- 2.0, 9.0 --, therefor.

Column 16,
Line 48, delete "micorgrams" and insert -- micrograms --, therefor.

Column1 16,
Line 64, delete "proprotional" and insert -- proportional --, therefor.

Column 17,
Line 4, delete "antracenyl" and insert -- anthracenyl --, therefor.

Column 17,
Line 51, delete "Microelectronices" and insert -- Microelectronics --, therefor.

Column 17,
Line 64, after "samples were" delete "were".

Column 18,
Line 31, after "on" delete "a".

Column 19,
Line 27-28, in Claim 11, delete "alkylthio." and insert -- alkylthio, --, therefor.

Column 19,
Line 45, in Claim 12, delete "alklthio," and insert -- alkylthio, --, therefor.

Column 19,
Line 45, in Claim 12, delete "haloalkyl" and insert -- haloalkyl, --, therefor.

UNITED STATES PATENT AND TRADEMARK OFFICE
CERTIFICATE OF CORRECTION

PATENT NO. : 7,315,042 B2
APPLICATION NO. : 10/991562
DATED : January 1, 2008
INVENTOR(S) : Christopher P. Gerlach It is certified that error appears in the above-identified patent and that said Letters Patent is hereby corrected as shown below:

<u>Column 19,</u>
Line 56, in Claim 15, delete "trans1" and insert -- trans-1 --, therefor.

<u>Column 19,</u>
Line 57, in Claim 15, delete "antracenyl" and insert -- anthracenyl --, therefor.

<u>Column 20,</u>
Line 25, in Claim 18, delete "(2naphthyl)" and insert -- (2-naphthyl) --, therefor.

<u>Column 20,</u>
Line 25, in Claim 18, delete "traits 1," and insert -- trans-1-, --, therefor.

<u>Column 20,</u>
Line 26, in Claim 18, delete "bis(2anthracenyl)" and insert -- bis-(2-anthracenyl) --, therefor.

<u>Column 20,</u>
Line 58, in Claim 20, delete "he" and insert -- the --, therefor.

Signed and Sealed this

Tenth Day of June, 2008

JON W. DUDAS
*Director of the United States Patent and Trademark Office*